Sept. 23, 1969 W. C. BENZING 3,469,147

DIELECTRICALLY ISOLATED STRUCTURES AND METHOD

Filed July 5, 1966

INVENTOR.
WALTER C. BENZING

BY Leo A. Plum, Jr.

ATTORNEY

United States Patent Office 3,469,147
Patented Sept. 23, 1969

3,469,147

DIELECTRICALLY ISOLATED STRUCTURES AND METHOD

Walter C. Benzing, Saratoga, Calif., assignor to Union Carbide Corporation, a corporation of New York Filed July 5, 1966, Ser. No. 562,740
Int. Cl. H01l 7/00, 3/00
U.S. Cl. 317—101 13 Claims

ABSTRACT OF THE DISCLOSURE

Dielectrically isolated semiconductor structures are provided which are substantially unaffected by the influence on carrier distribution in the monocrystalline semiconductor bodies of electrical charges in the polycrystalline substrate, comprising thin regions of high free-carrier concentration on the sides and bottoms of the monocrystalline bodies adjacent their isolating oxide layers whereby free carriers in the thin regions counter balance the induced effect of the charge in the polycrystalline material.

Figures 1, 2, 3, 4, 5, 6, 7, 8, 9, 10:
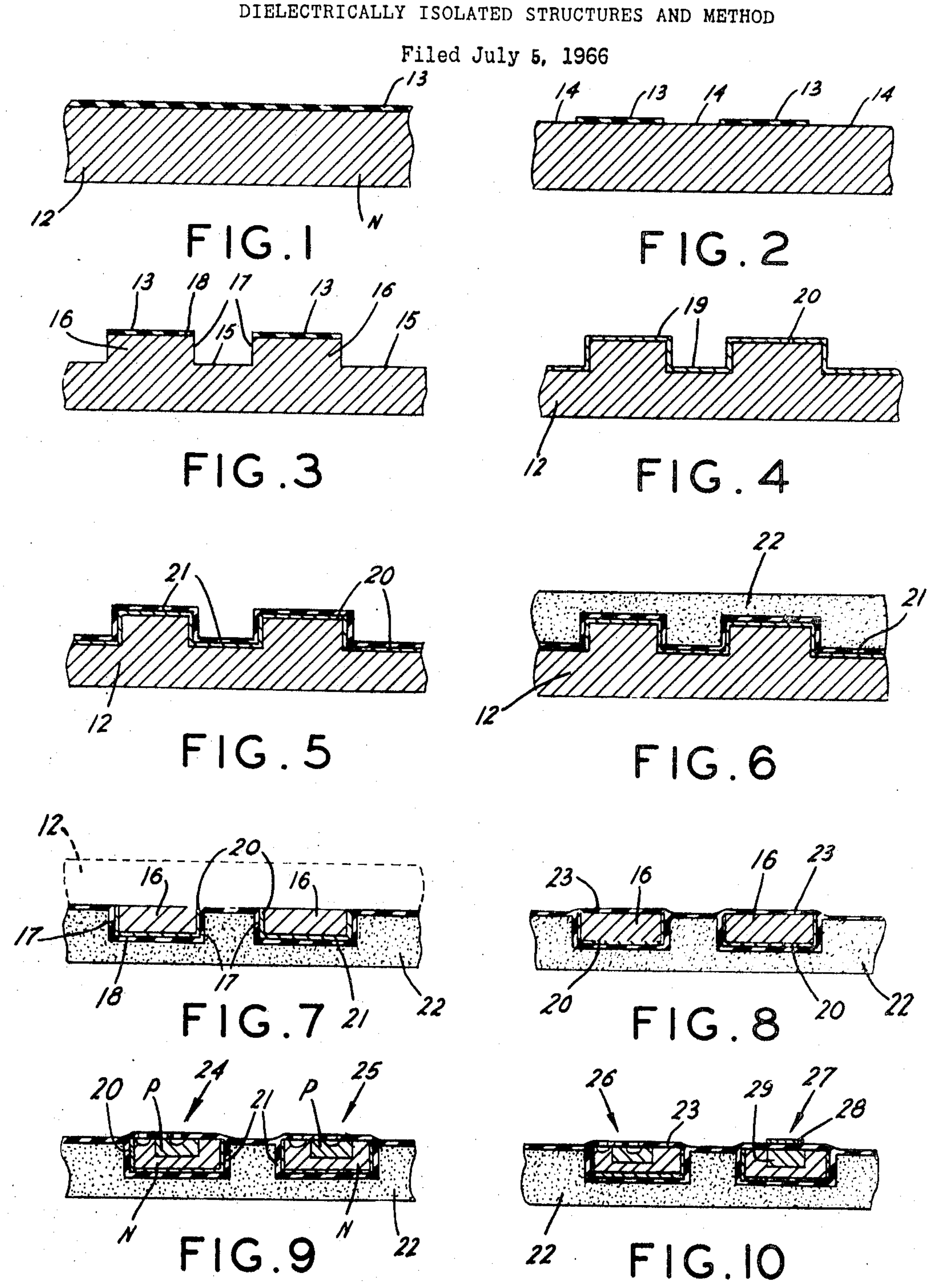

This invention relates to the fabrication of electronic devices and integrated circuits, and more particularly to the fabrication of improved devices and circuits wherein the devices are isolated in different regions of a monolithic bloc.

In a conventional monolithic integrated circuit various active and passive devices are formed in different regions of a single bloc of semiconductive material such as silicon. The devices are electrically isolated from one another by reversed-biased p-n junctions. In another system for fabricating monolithic integrated circuits, the various active and passive regions are physically and electrically isolated from each other by a layer of dielectric enclosing the region of silicon in which each device is formed. This system of dielectrically isolating the various components in an integrated monolithic circuit affords great reductions in parasitic capacitances and leakage currents, as well as advantages in device fabrication. In addition, such dielectric isolation of individual devices allows the fabrication in the same substrate or chip of silicon of normally interacting devices, such as a p-n-p transistor adjacent a n-p-n transistor.

The structure of such dielectrically isolated devices or integrated circuits consists of several bodies or regions of monocrystalline silicon, each body having an active or passive device formed therein, with each body of monocrystalline silicon surrounded on its side and bottom surfaces by a dielectric film of silicon dioxide, with these silicon dioxide-surrounded bodies of monocrystalline silicon all embedded in a larger body or substrate of polycrystalline silicon with the top surface of each individual device at the top surface of the polycrystalline substrate and a surface layer of silicon dioxide over the top surface of the whole structure. Interconnections between the various devices are made by thin films over the surface of the silicon dioxide coating with contacts to the underlying devices through holes in the coating.

As previously stated, the dielectric isolation technique yields significant reductions in parasitic capacitances; however, a serious drawback to the effective use of such structures has been found. The difficulty involves changes in the electrical characteristics of dielectrically isolated devices which occur during use of the structures. These changes can prevent the full achievement of the expected performance characteristics of the individual devices involved as well as the integrated circuits employing these devices.

It is the object of this invention therefore to provide means for controlling and eliminating the changes in electrical characteristics of devices in dielectrically isolated structures.

It is another object of this invention to provide dielectrically isolated devices and integrated circuits yielding the full electrical performance characteristics of the devices and circuits involved.

Other aims and advantages of the invention will be apparent from the following description, the appended claims and the attached drawings.

It has been found that when a substrate, typically polycrystalline silicon, having dielectrically isolated devices formed therein is operated, particularly in a floating or non-grounded state, that the imposition of any charge on the substrate will influence the carrier concentration within the body of monocrystalline silicon on the opposite side of the insulating silicon dioxide layer. This charge could be derived from a variety of sources including any electrostatic field in the vicinity of the device.

It is believed that the changes induced in the monocrystalline regions arise from the electrostatic field of the substrate acting across the insulating silicon dioxide layer surrounding the monocrystalline regions. A positive charge on the substrate attracts electrons from the bulk of the monocrystalline region down toward the oxide layer; a negative charge on the substrate repels electrons in the monocrystalline region away from the vicinty of the oxide layer, increasing the electron concentration in the bulk of the monocrystalline region. These changes in electron distribution in the monocrystalline region modify the overall behavior of the devices formed therein and make their operation less than suitable for many uses. As an example of this effect, the collector base breakdown voltage of a dielectrically isolated n-p-n transistor can be reduced from a normal value of 60 volts to 45 or 50 volts by placing a −45 volt charge on the substrate in which the transistor is formed.

In accordance with the above noted objectives, an invention is provided for controlling and eliminating, when necessary, the above described charge effects in dielectrically isolated structures comprising, forming a thin region of high free-carrier concentration in the monocrystalline silicon immediately adjacent the oxide layer, whereby sufficient electrons are provided in said region to counter balance the induced effect of the charge in the substrate region and thereby prevent any substantial change in the carrier distribution in the bulk of the monocrystalline silicon. By using the method of this invention, the entire equilization effect is restricted to a narrow zone immediately adjacent the insulating silicon dioxide layer.

In the drawings:

FIGS. 1 to 11 are schematic elevational views, in cross section and greatly exaggerated, of dielectrically isolated devices made according to this invention in various stages of fabrication.

The thin region of high free-carrier concentration can be formed by providing a region of heavily doped silicon immediately adjacent the silicon dioxide dielectric layer, as by doping the silicon body before the formation of this layer. Diffusion doping agents such as arsenic, antimony, boron, phosphorus, etc., can be used, as set forth hereinafter. Alternately, instead of diffusing dopant impurities into the silicon, a thin layer of an inert, conductive material can be formed over the surface of the silicon. Any material which can provide a high local concentration of electrons or holes adjacent to the oxide layer without adversely influencing the device or the properties of the insulating dielectric is suitable. An example of a suitable material is molybdenum disilicide ($MoSi_2$) which can be sputtered upon the monocrystalline silicon surface prior to the growth of the insulating oxide layer.

The invention will be explained more specifically by reference to the drawings wherein FIGS. 1 to 9 show steps involved in the fabrication procedure. As shown in FIG. 1, a monocrystalline body 12 of silicon (which can be a portion of a larger silicon wafer) for example of an N type conductivity is provided with a coating 13 of silicon dioxide, as by thermal oxidation. The body 12 will provide the regions of semiconductive material in which various active and passive devices can be formed and any necessary epitaxial layers needed for such devices can be provided in the silicon body at this time.

As shown in FIG. 2, holes 14 are formed through the oxide coating 13 at selected locations. Utilizing an etchant which will selectively attack only the silicon and not the oxide coating, channels 15 are formed in the silicon body, as shown in FIG. 3. Islands 16 of silicon are left projecting above the surface. It is understood that a similar series of channels are formed at right angles to those shown here to form a three dimensional structure.

The islands 16 will be the regions for monocrystalline silicon to be surrounded by a dielectric isolation film. According to this invention, the surfaces 17 and 18 of the islands can now be provided with a thin, localized region of high free-carrier concentration. The oxide coating 13 remaining on the top surfaces 18 of the islands is stripped off and the whole top surface 19 of the body 12 can be provided with a thin layer 20 of dopant material, as by deposition, to provide the thin region of high free-carrier concentration. This is shown in FIG. 4.

Thereafter, as shown in FIG. 5, a layer of silicon dioxide 21 is grown over the body 12 covering the thin layer 20 of dopant material. Next as is conventional in the dielectric isolation technique, polycrystalline silicon 22 is deposited over the surface of the oxide 21 to a desired thickness, generally several mils to provide support for the devices, as shown in FIG. 6.

The monocrystalline silicon 12 is lapped down to the level of the oxide coating 21 and inverted as shown in FIG. 7. The islands 16 of monocrystalline silicon already provided with a dielectric layer 21 of oxide around their side 17 and bottom surfaces 18 are left embedded in the polycrystalline material 22 which now is the substrate of the device. As shown in FIG. 8, oxide layers 23 are formed over the surfaces of the islands. The thin regions 20 of high free-carrier concentration are found in the monocrystalline islands immediately adjacent the oxide layer, whereby sufficient electrons are provided in this region to counter balance the induced effect of any charge in the substrate 22 acting across the oxide layer 21 surrounding the monocrystalline regions or islands 16. Various active and passive devices can now be formed in the islands 16 using conventional oxide masking and diffusion techniques. FIG. 9 shows a device having dual n-p-n transistors 24 and 25 situated in the same substrate 22 and isolated one from another by the oxide layer 21 surrounding each island and protected from electrostatic charge effects by the thin regions 20 provided by this invention. FIG. 10 shows a transistor 26, and a capacitor 27 consisting of a metallic film 28, the dielectric 23 and a diffused region 29. The thin regions 20 of high free-carrier concentration again protect the transistor 26 and the capacitor 27 from induced charge effects.

The thin region of high free-carrier concentration can be formed by diffusion of dopant material into a thin, localized region of the monocrystalline silicon islands, as stated previously. Suitable dopant impurities for this purpose are arsenic, antimony, boron, phosphorus or any other suitable material. The sources of these dopant impurities can be such compounds as arsenic trioxide ($As_2O_3$), antimony pentochloride ($SbCl_5$), boron tribromide or trichloride ($BBr_3$ and $BCl_3$) and other suitable materials. The compounds can be vaporized and mixed in a stream of a carrier gas such as oxygen or oxygen-nitrogen mixtures and this stream passed over the wafer. It is preferred to employ a two-step procedure in forming the thin region of high free-carrier concentration which consists of a predeposition step and a later drive-in operation. The predeposition of dopant material is performed with the wafer at a temperature of from about 1000° to 1200° C. in the case of arsenic oxide deposition. Only a slight diffusion of arsenic will take place under such conditions. The later oxide growing and diffusion operations which will be performed on the wafer will accomplish the driving in of the arsenic to form the thin region. After the predeposition step the arsenic-doped region may extend about 2μ into the surfaces of the silicon island. The later drive-in of the arsenic will increase the thickness of the region to about 4μ. It is preferred to limit the depth of the thin region to about 4μ so as not to interfere with the structure and operation of the active and passive devices subsequently formed in the monocrystalline island.

In order to keep the region of high free-carrier concentration thin and localized it is preferred to employ the predeposition procedure outlined above. Additionally it is preferred to perform the subsequent fabrication steps at the lower range of temperatures for such steps; for example, any subsequent oxide growths and diffusions can be performed at temperatures of 900° to 1100° C. In this way further diffusion of the dopant material from the thin region will be minimized. Arsenic is a preferred dopant material in this regard because it has a low diffusion coefficient and will remain localized during subsequent process steps.

The concentration of dopant impurity in the thin region is another important aspect of the invention. In order to provide the needed high concentration of free-carriers, it has been found that this region must have a resistivity of less than about 0.005 ohm-cm. and preferably a resistivity of about 0.001 ohm-cm. Such a concentration may be formed in the region by depositing arsenic over the surfaces of the silicon islands 16 by a predeposition step such that the resistance (V/I) of the deposited film 20 is 10 ohms or less as measured by the 4 point probe method. This method of measurement is set forth in the following article: "Measurement of Sheet Resistivity With the Four Point Probe" by F. M. Smits in the Bell System Technical Journal, May 1958, page 711. The arsenic deposit may be formed to show resistances as low as 1 ohm in a preferred embodiment. The higher the concentration of arsenic in the thin region, the more effective will be the elimination of the changes in the monocrystalline region due to induced charge effects.

The concentrations of other dopant materials used in place of arsenic should be made equivalent to the values given above.

It is important to note that the use of a thin, localized region of high free-carrier concentration in the devices of this invention is not the same as the prior art use of high conductivity wells or buried layers in the collector regions of dielectrically insulated transistors. In the case of such buried layers, their function is to reduce the series resistance in collector regions fabricated in lightly doped semiconductor material to give a desired $V_{CE\ (SAT)}$. There an N type collector region might be provided with a N+ buried layer having a resistivity of 0.1 ohm-cm. or 0.05 ohm-cm. In the case of the present invention, the thin region of high, free-carrier concentration is doped to provide a resistivity of less than 0.005 ohm-cm. and preferably 0.001 ohm-cm. The higher resistivity buried layer regions may provide some diminution of induced electrostatic effects, say about a 30 percent reduction, but the substantial reduction or elimination of such effects requires the higher conductivities provided in the thin regions of the devices of this invention. Additionally, buried layers in conventional transistor structures are generally of the same conductivity type as the collector itself, whereas for the purposes of this invention a N type arsenic doped region is suitable for use in monocrystalline regions of both N type and P type conductivity. However, it is within the scope of this invention to use P type materials, such as boron, to form the thin regions in P type monocrystalline regions where the transistor collectors may also be of P type material; and to use N type dopant materials in N type monocrystalline regions where transistor collectors will be of N type material. In such cases, the advantages of eliminated induced charge effects will accompany a reduction in collector resistance also afforded by the thin regions of this invention. It is another distinction of this invention that the thin regions of high free-carrier concentration as provided by the present invention are to be used in monocrystalline islands in which are formed passive devices such as resistors or the capacitor illustrated schematically in FIG. 10.

Figure 11:
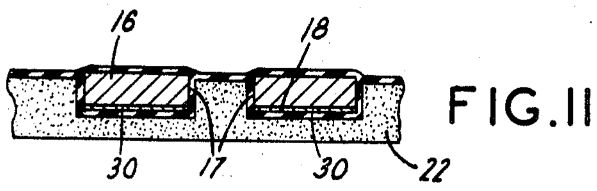

In another embodiment of the present invention, shown in FIG. 11, a thin region 30 of high free-carrier concentration is provided only at the bottom surface 18 of the island 16. The reduction in induced effects may not be as great with this arrangement since the electrostatic charge in the substrate acts over the whole of the oxide layer including the sides 17 of the island 16 and not merely the bottom surface 18. However the protection afforded by such a region 30 may be substantial. This thin region 30 may be formed by depositing dopant material only over the top surface 18 of the islands 16 shown in FIG. 3.

The thin regions of high free-carrier concentration may be formed by evaporation instead of diffusion, and also by sputtering conductive materials on the islands 16 to provide the region 20. Molybdenum disilicide may be cosputtered using molybdenum and silicon targets in a suitable apparatus. A one $\mu$ thick layer of molybdenum disilicide is suitable.

The device shown in FIG. 9 is particularly useful, consisting of two transistors fabricated in the same chip or body of silicon. While the leads to the elements of the transistors are not shown for simplicity, it is understood that six contacts are involved. A six lead package may be used to contain the device since no separate lead is needed to ground a substrate fabricated according to the procedures of this invention.

It is readily apparent to those skilled in the art that the procedures set forth herein may be used in fabricating all manners of useful devices and integrated circuits. The devices illustrated are only examples and are not meant to represent the only uses of the invention.

What is claimed is:

1. A dielectrically isolated structure comprising a body of polycrystalline material having a substantially planar surface, at least two discrete spaced-apart bodies of monocrystalline semiconductive material surrounded by an isolating oxide layer on their side and bottom surfaces and embedded in the polycrystalline material with their upper surfaces at the surface of the polycrystalline material and with the isolating oxide layers separating said monocrystalline bodies from each other and from the polycrystalline material, electronic devices formed in said bodies of monocrystalline material with electrical contacts to said devices on the surface of the monocrystalline bodies, said bodies of monocrystalline material having thin regions of high free-carrier concentration immediately adjacent at least portions of the isolating oxide layers on their side and bottom surfaces, said thin regions being otherwise unconnected by any low resistance path to the electrical contacts to the electronic devices formed in the monocrystalline bodies, whereby sufficient carriers are provided in said regions to counterbalance the induced effect of any charge present in the polycrystalline body and thereby prevent any substantial change in the carrier distribution in the bulk of the monocrystalline semiconductor material.

2. The structure as in claim 1 in which the upper surface of the polycrystalline material and discrete bodies embedded therein is at least partially covered with a layer of oxide.

3. The structure as in claim 2 in which the polycrystalline material is silicon and the monocrystalline material is silicon.

4. The structure as in claim 3 in which the thin regions of high free-carrier concentration are doped regions in the monocrystalline bodies.

5. The structure as in claim 3 in which the thin regions of high free-carrier concentration are layers of conductive material.

6. The structure as in claim 5 in which the conductive material is molybdenum disilicide.

7. The structure as in claim 4 in which the doped regions contain dopant impurities selected from the group consisting of arsenic, antimony, boron, and phosphorus.

8. The structure as in claim 7 in which the thin region is doped to a resistivity of no more than about 0.005 ohm-cm.

9. The structure as in claim 7 in which the thin region is doped to a resistivity of about 0.001 ohm-cm.

10. The structure as in claim 7 in which the thin region is no more than about 4$\mu$ in thickness.

11. The structure as in claim 4 in which the thin region is an arsenic diffused region having a resistivity of no more than about 0.005 ohm-cm.

12. The structure as in claim 4 in which the thin region is an arsenic diffused region no more than about 4$\mu$ in thickness and having a resistivity between about 0.005 and 0.001 ohm-cm.

13. The dielectrically isolated structure of claim 1 in which the thin regions of high free-carrier concentration are adjacent only the isolating oxide layer on the bottom surfaces of the monocrystalline bodies.

References Cited

UNITED STATES PATENTS

| | | |
|---|---|---|
| 3,368,113 | 2/1968 | Shaunfield. |
| 3,381,182 | 4/1968 | Thornton. |

ROBERT K. SCHAEFER, Primary Examiner

J. R. SCOTT, Assistant Examiner

U.S. Cl. X.R.

317—235